(12) United States Patent
Iwakiri

(10) Patent No.: US 7,067,787 B2
(45) Date of Patent: Jun. 27, 2006

(54) SOLID STATE DETECTOR AND METHOD OF MANUFACTURING SAME

(75) Inventor: Naoto Iwakiri, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/302,193

(22) Filed: Dec. 14, 2005

(65) Prior Publication Data

US 2006/0091291 A1 May 4, 2006

Related U.S. Application Data

(62) Division of application No. 11/008,211, filed on Dec. 10, 2004.

(30) Foreign Application Priority Data

Dec. 10, 2003 (JP) .............................. 2003-411623

(51) Int. Cl.
*H01L 27/00* (2006.01)
*G01T 1/24* (2006.01)

(52) U.S. Cl. .............................. 250/208.1; 250/370.08; 250/591; 378/98.8

(58) Field of Classification Search ............. 250/208.1, 250/214.1, 370.08, 370.09, 370.15, 580, 250/591; 378/98.8, 98.12
See application file for complete search history.

(56) References Cited

U.S. PATENT DOCUMENTS

| 4,857,723 A | 8/1989 | Modisette |
| 5,331,179 A | 7/1994 | Lee et al. |
| 6,501,089 B1 * | 12/2002 | Kuwabara .................... 250/591 |

* cited by examiner

*Primary Examiner*—Kevin Pyo
(74) *Attorney, Agent, or Firm*—Sughrue Mion, PLLC

(57) ABSTRACT

Deterioration of a photoconductive layer is prevented, by suppressing the application of heat during connection of a second electrode with an external terminal. A solid state detector is constituted by: an external terminal, which is electrically connected to a voltage source for applying a recording voltage to the second electrode when recording image information at a charge accumulating portion; and a connecting member formed by a conductive elastic material, of which a first end is fixed to the external terminal, and a second end contacts the second electrode by elastic force.

2 Claims, 4 Drawing Sheets

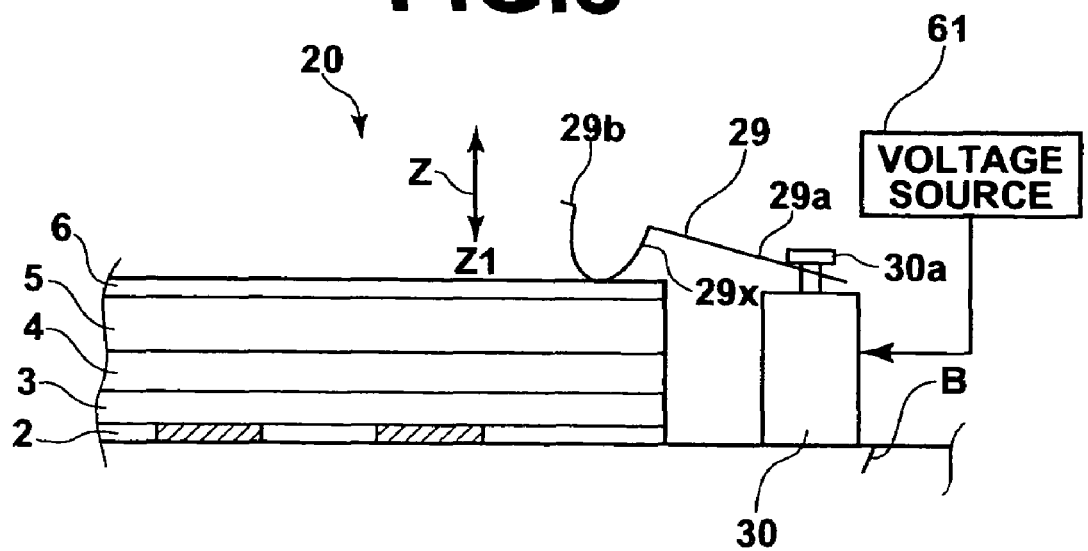
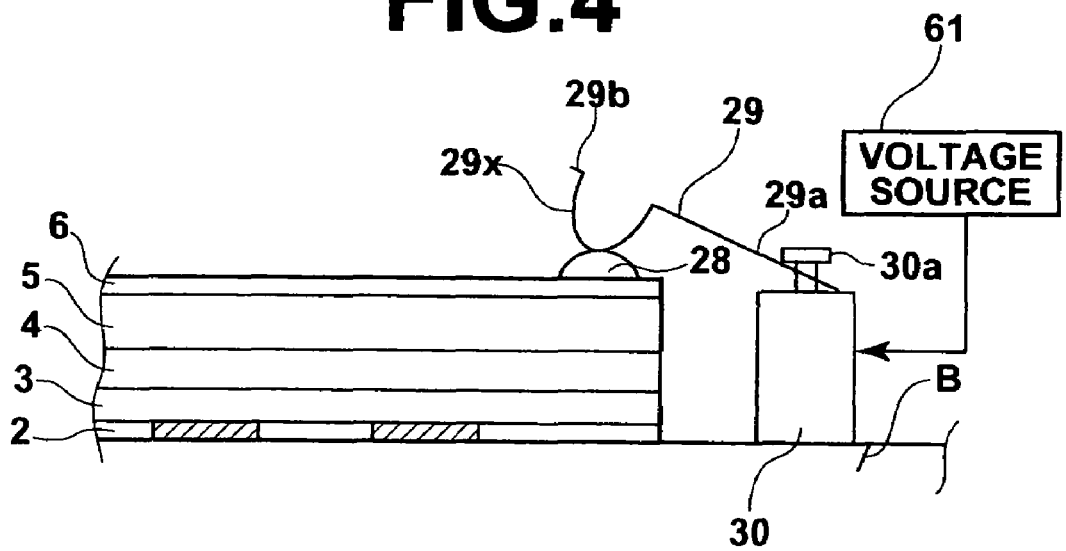

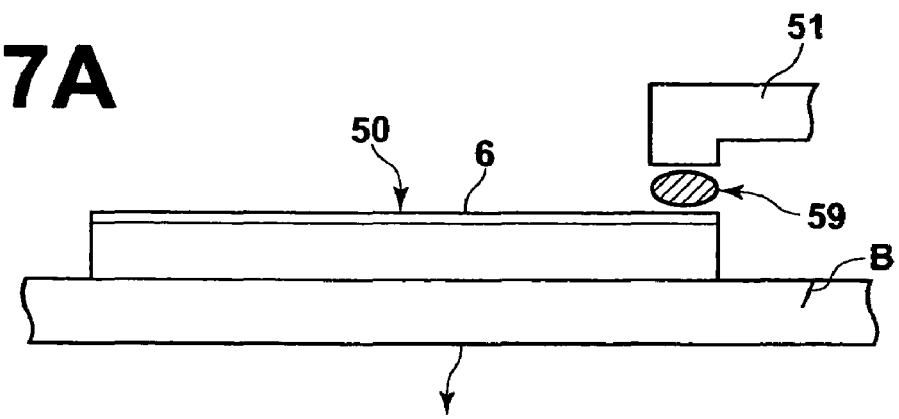
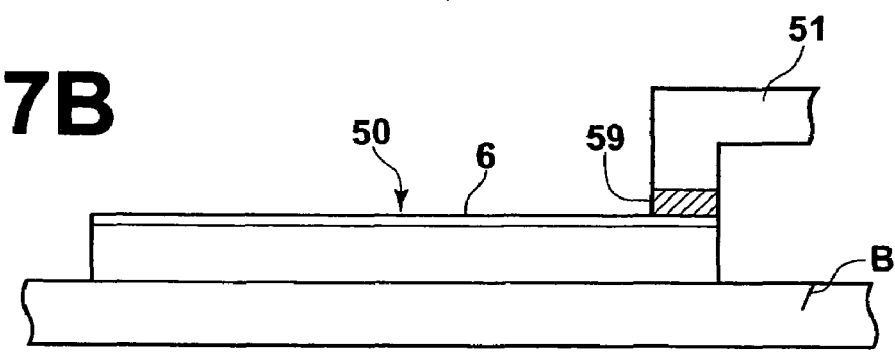
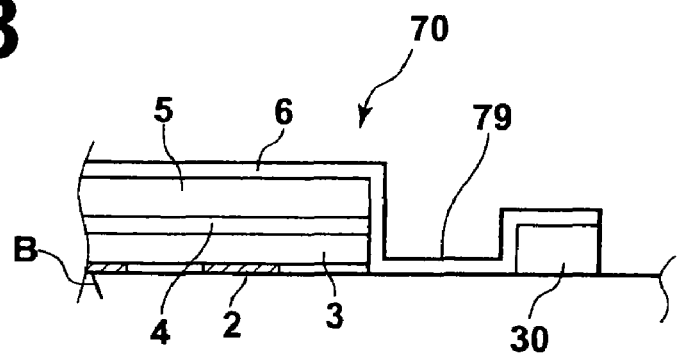

SOLID STATE DETECTOR AND METHOD OF MANUFACTURING SAME

This is a divisional of application Ser. No. 11/008,211 filed Dec. 10, 2004, the entire disclosure of the prior application, application Ser. No. 11/008,211 is hereby incorporated by reference.

BACKGROUND OF THE INVENTION

Field of the Invention

The present invention relates to a solid state detector, to which a recording voltage is applied from a voltage source, during recording of image information. The present invention also relates to a method of manufacturing such a solid state detector.

In the field of medical radiation imaging, there are known methods that seek to reduce the radiation dosage received by a subject, and to improve diagnostic performance. Such methods employ radiation solid state detectors having photoconductive layers, such as selenium plates that react to X-rays and other types of radiation, as image detectors. The radiation solid state detectors are irradiated with radiation, and charges corresponding to the radiation dosage are accumulated at charge accumulating portions within the radiation solid state detectors. Thereby, radiation images are recorded as latent images at the charge accumulating portions. Radiation image information is read out by scanning the radiation solid state detector, on which the radiation image information is recorded, with readout light in beam or line form.

In the aforementioned solid state detector, first electrodes and a second electrode are provided so as to sandwich the photoconductive layer therebetween. The first and second electrodes are provided so as to enable recording of the image information at the charge accumulating portion and to enable readout of the recorded image information. The first electrodes are stacked, for example, on a light transmissive substrate. Then, the photoconductive layer and the second electrode are stacked on the first electrodes. Image information is recorded, by applying recording voltage to the first and second electrodes, to move the charges generated by the photoconductive layer to the charge accumulating portion by the recording voltage. On the other hand, the image information is read out, by the electrodes detecting current, corresponding to the amount of charges accumulated at the charge accumulating portion. Accordingly, it is necessary for the first and second electrodes of the solid state detector to be electrically connected to an external voltage source for applying the recording voltage.

In the case that the voltage source and the solid state detector are electrically connected by soldering, high heat is applied to the solid state detector during the soldering process. Selenium, which forms the photoconductive layer of the solid state detector, is heat sensitive. Therefore, a problem exists in that regions of the photoconductive layer, to which high heat is applied during the soldering process, become defective. Image information cannot be recorded at the defective regions of the photoconductive layer, therefore, image information cannot be recorded faithfully.

SUMMARY OF THE INVENTION

The present invention has been developed in view of the above problem. It is an object of the present invention to provide a solid state detector, in which the application of heat is suppressed during connection of an external terminal to a second electrode, thereby preventing deterioration of a photoconductive layer. It is another object of the present invention to provide a method of manufacturing such a solid state detector.

The first solid state detector of the present invention is a solid state detector provided on a substrate, comprising:

first electrodes, stacked on the substrate;

a photoconductive layer that generates charges corresponding to amounts of recording electromagnetic waves bearing image information, stacked on the first electrodes;

a second electrode, stacked on the photoconductive layer;

a charge accumulating portion that records the image information by accumulating the charges generated by the photoconductive layer;

an external terminal, which is electrically connected to a voltage source for applying recording voltage to the second electrode during recording of the image information in the charge accumulating portion; and a connecting member, having a first end connected to the external terminal, and a second end, which is an elastic conductive material, connected to the second electrode by elastic force.

The second solid state detector of the present invention is a solid state detector provided on a substrate, comprising:

first electrodes, stacked on the substrate;

a photoconductive layer that generates charges corresponding to amounts of recording electromagnetic waves bearing image information, stacked on the first electrodes;

a second electrode, stacked on the photoconductive layer;

a charge accumulating portion that records the image information by accumulating the charges generated by the photoconductive layer;

an external terminal, which is electrically connected to a voltage source for applying recording voltage to the second electrode during recording of the image information in the charge accumulating portion; and a connecting member formed of wire, having a first end connected to the external terminal, and a second end connected to the second electrode by ultrasonic welding.

The third solid state detector of the present invention is a solid state detector provided on a substrate, comprising:

first electrodes, stacked on the substrate;

a photoconductive layer that generates charges corresponding to amounts of recording electromagnetic waves bearing image information, stacked on the first electrodes;

a second electrode, stacked on the photoconductive layer;

a charge accumulating portion that records the image information by accumulating the charges generated by the photoconductive layer;

an external terminal, which is electrically connected to a voltage source for applying recording voltage to the second electrode during recording of the image information in the charge accumulating portion; and a connecting member formed of an amalgam, from which mercury has been removed, that connects the external terminal and the second electrode.

The method of manufacturing a solid state detector of the present invention is a method of manufacturing a solid state detector provided on a substrate, comprising:

first electrodes, stacked on the substrate;

a photoconductive layer that generates charges corresponding to amounts of recording electromagnetic waves bearing image information, stacked on the first electrodes;

a second electrode, stacked on the photoconductive layer;

a charge accumulating portion that records the image information by accumulating the charges generated by the photoconductive layer; and an external terminal, which is electrically connected to a voltage source for applying recording voltage to the second electrode during recording of the image information in the charge accumulating portion; comprising the steps of:

providing an amalgam, which is mercury with a metal dissolved therein, on the second electrode;

placing the external terminal on the amalgam; and heating the amalgam within a vacuum, to remove the mercury from the amalgam, thereby forming a connecting member, which is formed by the metal, that connects the second electrode and the external terminal.

Here, "heating the amalgam within a vacuum" means to heat within a temperature range that does not generate defects in the photoconductive layer due to phase transition.

According to the first solid state detector of the present invention, an elastic material is employed as the connecting member for connecting the second electrode to the voltage source. Therefore, the connecting member is pressed against the second electrode to contact them by elastic force. Thereby, an electric connection can be established without applying heat to the solid state detector. Accordingly, deterioration of the photoconductive layer due to heat can be prevented.

Note that the material of the connecting member may be of a lower hardness than that of the second electrode. If this configuration is adopted, in the case that great pressure is applied between the second electrode and the connecting member due to friction or vibration, the connecting member is crushed. Thereby, damage to the second electrode can be prevented.

According to the second solid state detector of the present invention, a wire is employed as the connecting member for connecting the second electrode to the voltage source. The electrical connection between the second electrode and the wire is established by ultrasonic welding. Therefore, the heat transmitted to the photoconductive layer from the second electrode is reduced, and deterioration of the photoconductive layer due to heat can be prevented.

According to the third solid state detector of the present invention and the method of manufacture thereof, an amalgam, which is mercury with a metal dissolved therein, is provided on the second electrode; the external terminal is placed on the amalgam; and the amalgam is heated within a vacuum, to remove the mercury from the amalgam, thereby forming a connecting member, which is formed by the metal, that connects the second electrode and the external terminal. Therefore, the heat applied to the solid state detector can be minimized. Thereby, the heat transmitted to the photoconductive layer from the second electrode is reduced, and deterioration of the photoconductive layer due to heat can be prevented.

DESCRIPTION OF THE DRAWINGS

FIG. 3 is a model diagram that illustrates a solid state detector according to a second embodiment of the present invention.

FIG. 4 is a model diagram that illustrates a modification of the solid state detector according to the second embodiment of the present invention.

FIGS. 7A and 7B illustrate the steps of a preferred embodiment of a manufacturing method of solid state detectors according to the present invention.

FIG. 8 is a model diagram that illustrates a solid state detector according to a fifth embodiment of the present invention.

DESCRIPTION OF THE PREFERRED EMBODIMENTS

Figure 1:
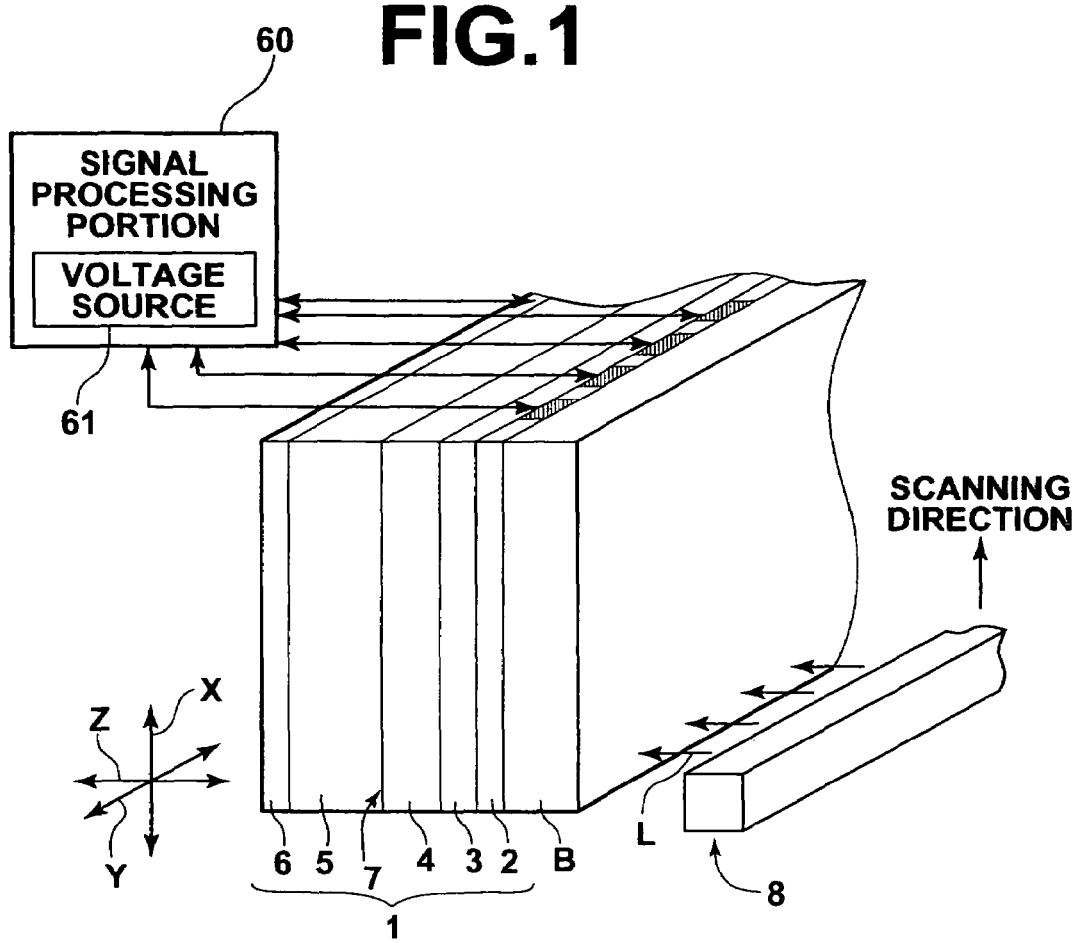
FIG. 1 is a structural diagram that illustrates a solid state detector according to a first embodiment of the present invention.

FIG. 1 is a structural diagram that illustrates a solid state detector 1 according to a first embodiment of the present invention. The solid state detector 1 will be described with reference to FIG. 1.

The solid state detector 1 comprises: first electrodes 2; a readout photoconductive layer 3; a charge transport layer 4; a recording photoconductive layer 5; and a second electrode 6, stacked in the order of enumeration. The solid state detector 1 is provided on a substrate B, formed by a light transmissive material such as glass.

The first electrodes 2 are constituted by linear electrodes, which are formed substantially parallel, extending in a scanning direction (direction indicated by arrow X), as illustrated in FIG. 3. The first electrodes 2 may be formed by NESA film or the like, and each linear electrode is in an electrically insulated state. The readout photoconductive layer 3, which exhibits conductivity and generates charge pairs when irradiated by readout light L, is stacked on the first electrodes 2. The charge transport layer 4 is stacked on the readout photoconductive layer 3. The charge transport layer 4 functions substantially as an insulator with respect to negative charges, and functions substantially as a conductor with respect to positive charges, for example.

The recording photoconductive layer 5 exhibits conductivity and generates charge pairs when irradiated by recording electromagnetic waves (light or radiation), and is stacked on the charge transport layer 4. The readout photoconductive layer 3 and the recording photoconductive layer 5 are formed by amorphous selenium (a-Se), for example.

A charge accumulating portion 7 is formed at the interface of the charge transport layer 4 and the recording photoconductive layer 5. Electrons, which are generated within the recording photoconductive layer 5, are caused to move toward the first electrodes 2 by an electric field, formed between the first electrodes 2 and the second electrode 6. This movement, however, is restricted by the charge transport layer 4. Accordingly, charges corresponding to the amount of irradiated recording electromagnetic waves are accumulated at the charge accumulating portion 7 as a latent image, thereby recording image information. The second electrode 6, which is formed of a material transmissive with respect to the recording electromagnetic waves, such as an ITO (Indium Tin Oxide) film, is stacked on the recording photoconductive layer 5. The first electrodes 2 and the second electrode 6 are electrically connected to a signal processing portion 60. The signal processing portion 60 comprises a voltage source 61, for applying recording voltage HV.

During recording image information on the solid state detector, first, high voltage is applied between the first electrodes 2 and the second electrode 6, by the voltage source 61. By the application of the voltage, the first electrodes 2 become charged with negative charges, and the second electrode 6 become charged with positive charges. Next, recording electromagnetic waves are irradiated from the side of the second electrode 6. Positive/negative charge pairs are generated within the recording photoconductive layer 5, corresponding to the amount of irradiated recording electromagnetic waves. Of the charge pairs, positive holes move toward the second electrode 6, couple with the negative charges at the second electrode 6, and disappear. Meanwhile, electrons of the charge pairs move toward the first electrodes 2, but their movement is restricted by the charge transport layer 4. Thereby, the image information is recorded at the charge accumulating portion 7 as a latent image.

During readout of the image information, which is recorded at the charge accumulating portion 7, readout light L is scanned and irradiated from the side of the first electrodes 2, by a readout light irradiating portion 8. Thereby, chare pairs are generated within the readout photoconductive layer 3, corresponding to the amount of irradiated readout light L. Of the charge pairs, positive holes pass through the charge transport layer 4, couple with the negative charges accumulated at the charge accumulating portion 7, and disappear. Meanwhile, electrons of the charge pairs move toward the first electrodes 2 and couple with positive charges. Current flows through the signal processing portion 60 when the positive holes and the negative charges couple at the first electrodes 2. The image information is read out by the signal processing portion 60 detecting the changes in current.

As described above, it is necessary to apply the recording voltage HV from the voltage source 61 to the second electrode 6 during recording of the image information. Therefore, it is necessary to electrically connect the second electrode 6 and the voltage source 61. Meanwhile, amorphous selenium, which is the material of the photoconductive layer in the present embodiment, is heat sensitive, and the phase transition temperature thereof is approximately 42° C. Accordingly, the electrical connection between the second electrode 6 and the voltage source 61 must be performed at temperatures not exceeding the phase transition temperature. That is, in the case that the second electrode 6 and the voltage source 61 are electrically connected by soldering, for example, the heat applied during the soldering operation is transmitted to the photoconductive layer. This causes the photoconductive layer to undergo phase transition, and the phase transitioned regions become defective regions, at which image information cannot be recorded. Therefore, a connecting member as described below is employed to establish the electrical connection between the second electrode 6 and the voltage source 61.

Figure 2:
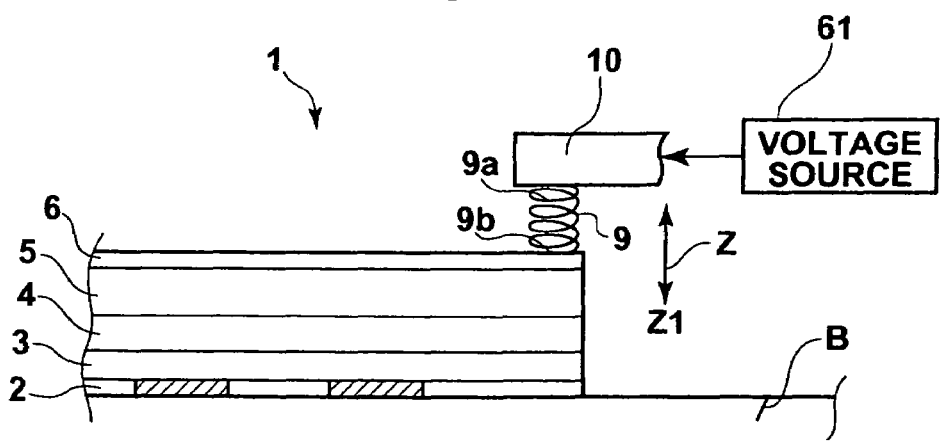
FIG. 2 is a model diagram of the peripheral portions of the connecting member of the solid state detector of the present invention.

FIG. 2 is a model diagram of the peripheral portions of the connecting member of the solid state detector 1. The connecting member 9 and an external terminal 10 will be described with reference to FIG. 2.

The electrical connection between the second electrode 6 and the voltage source 61 is established via the connecting member and the external terminal 10. The connecting member 9 is a spring formed of a conductive material, such as gold or silver, which is expansible in the direction indicated by arrow Z. The external terminal 10 is positioned above the second electrode 6, and is electrically connected to the voltage source 61. The external terminal 10 is supported, for example, by a frame (not shown) that houses the solid state detector 1 when the solid state detector 1 is loaded into an image readout apparatus. The length of the spring, which is employed as the connecting member 9, is formed to be longer than the distance between the second electrode 6 and the external terminal 10.

A first end 9a of the connecting member 9 is fixed and electrically connected to the external terminal 10 by welding, adhesive attachment, or the like. A second end 9b of the connecting member 9 contacts the second electrode 6 and is electrically connected therewith. That is, the second end 9b of the connecting member 9 is electrically connected with the second electrode 6 by being pressed thereagainst by the elastic force of the spring. Accordingly, the high voltage is applied to the second electrode 6 from the voltage source 61, via the external terminal 10 and the connecting member 9, during recording of the image information on the solid state detector 1.

According to the first embodiment described above, the electrical connection between the second electrode 6 and the voltage source 61 is established by employing the connecting member 9, which is an elastic material, without applying heat. Therefore, heat is not applied to the recording photoconductive layer 5, and deterioration of the recording photoconductive layer 5 due to heat can be prevented. In addition, because the connecting member 9 is formed of an elastic material, disconnection of the second electrode 6 and the connecting member 9 due to cracks formed by vibration of the solid state detector 1 or the like, is prevented.

Note that in the first embodiment, a conductive flat plate may be provided at the second end 9b of the spring connecting member 9. In this case, the flat plate is caused to contact the second electrode 6 by elastic force of the spring. By adopting this configuration, the contact area between the second electrode 6 and the connecting member 9 is increased, thereby positively establishing the electrical connection between the second electrode 6 and the connecting member 9.

In the first embodiment described above, the connecting member 9 comprises a single spring. However, the connecting member 9 may comprise a plurality of springs. In this case, it is not necessary for all of the plurality of springs to be conductive, as long as at least one spring from among the plurality is conductive.

FIG. 3 is a model diagram that illustrates a solid state detector 20 according to a second embodiment of the present invention. The solid state detector 20 will be described with reference to FIG. 3. Note that parts of the solid state detector 20, which are of the same construction as those of the solid state detector 1, are labeled with the same reference numerals, and descriptions thereof will be omitted.

In the solid state detector 20 of FIG. 3, a connecting member 29 is formed of a plate spring, having a protrusion 29x at a second end 29b thereof. An external terminal 30 is provided on the substrate B, and is electrically connected to the voltage source 61. A first end 29a of the connecting member 29 is fixed and electrically connected to the external terminal 30 by a pin 30a being inserted through an aperture provided in the connecting member 29. The second end 29b of the connecting member 29 is electrically connected to the second electrode 6, by the protrusion 29x contacting the second electrode 6. That is, the connecting member contacts the second electrode 6 while applying pressure thereto in the direction indicated by arrow Z, by elastic force of the plate spring.

According to the second embodiment described above, in the same manner as the first embodiment, the electrical connection between the second electrode 6 and the voltage source 61 is established by employing the connecting member 9, which is an elastic material, without applying heat.

Therefore, heat is not applied to the recording photoconductive layer 5, and deterioration of the recording photoconductive layer 5 due to heat can be prevented. In addition, because the connecting member 9 is formed of an elastic material, disconnection of the second electrode 6 and the connecting member 9 due to cracks formed by vibration of the solid state detector 1 or the like, is prevented.

Note that as illustrated in FIG. 4, the connecting member 29 may further comprise a shock absorbing member 28, formed of a metal having a lower hardness than the second electrode 6, such as a conductive sponge or metallic In. The shock absorbing member 28 is provided between the protrusion 29x and the second electrode 6. In this case, the force applied to the recording photoconductive layer 5 and the like from the connecting member 29 can be dissipated by the shock absorbing member 28, thereby preventing damage to the second electrode 6.

Even if the shock absorbing member 28 is not provided, the connecting member 29 may be formed of a material having a lower hardness (a softer material) than the ITO film, which is the material of the second electrode 6, such as copper. In this case, the force applied to the second electrode 6 by the connecting member 29, which is a plate spring, can be dissipated by deformation of the protrusion 29x, thereby preventing damage to the second electrode 6.

Figure 5:
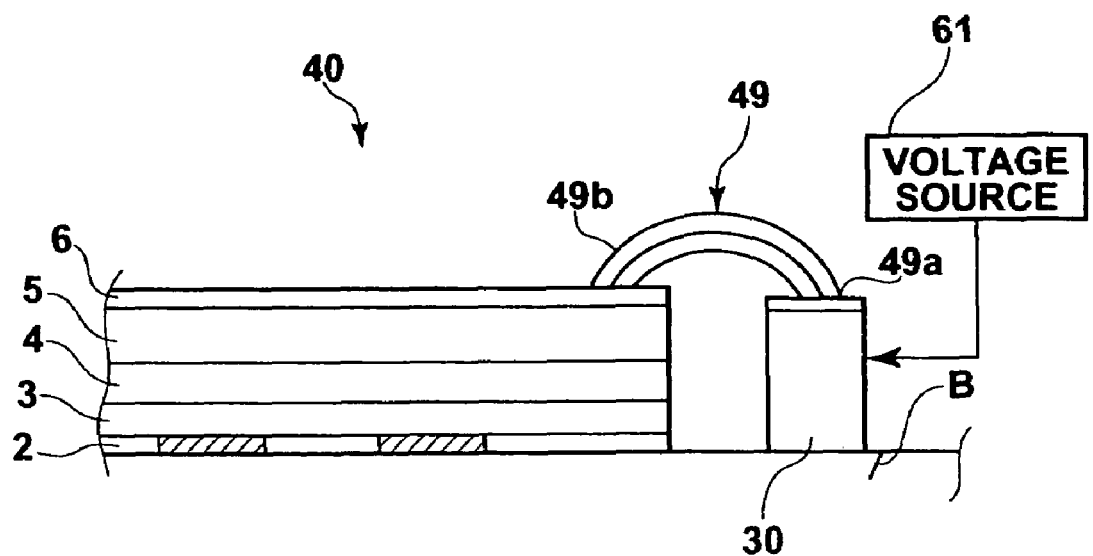
FIG. 5 is a model diagram that illustrates a solid state detector according to a third embodiment of the present invention.

FIG. 5 is a model diagram that illustrates a solid state detector 40 according to a third embodiment of the present invention. The solid state detector 40 will be described with reference to FIG. 5. Note that parts of the solid state detector 40, which are of the same construction as those of the solid state detector 1, are labeled with the same reference numerals, and descriptions thereof will be omitted.

A connecting member 49 of the solid state detector 40 illustrated in FIG. 5 is formed of a conductive wire. A first end 49a of the connecting member 49 is connected to the external terminal 30, and a second end 49b is connected to the second electrode 6. Here, the connection between the second electrode 6 and the connecting member 49 is established by wire bonding employing ultrasonic welding.

According to the third embodiment described above, the connecting member 49 is formed by a wire, and the connection between the second electrode 6 and the external terminal 30 is established by wire bonding employing ultrasonic welding. Therefore, the range in which heat is generated can be limited to the vicinity of the wire and the amount of generated heat can be reduced, compared to a case in which soldering is performed. Accordingly, the generation of heat is minimized during establishment of the electrical connection between the second electrode 6 and the external terminal 30, and generation of defects in the recording photoconductive layer 5 due to heat can be prevented.

Note that the connection between the connecting member 49 and the external terminal 30 is established by wire bonding. The wire bonding may be performed by ultrasonic welding or by welding with heat. By establishing the connection between the connecting member 49 and the external terminal 30 by ultrasonic welding, heat generated in the vicinity of the external terminal 30 is not transmitted to the recording photoconductive layer 5. Therefore, deterioration of the recording photoconductive layer 5 can be prevented, particularly when ultrasonic welding is employed.

The connecting member 49 may comprise a single wire, or a plurality of wires. In the case that the connecting member 49 comprises a plurality of wires, even if one of the wires is cut, the electrical connection between the second electrode 6 and the external terminal 30 is secured by the other wires. Therefore, the reliability of the apparatus is improved.

Figure 6:
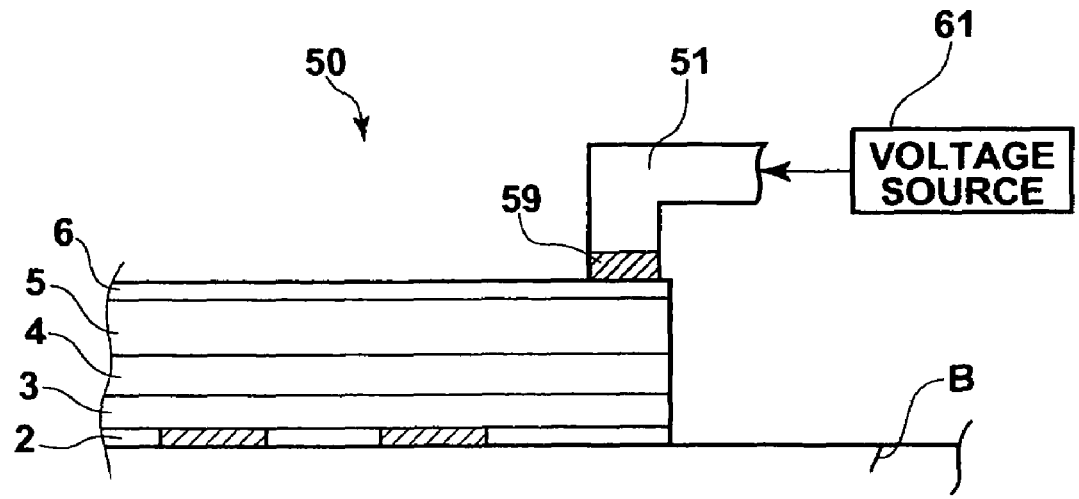
FIG. 6 is a model diagram that illustrates a solid state detector according to a fourth embodiment of the present invention.

FIG. 6 is a model diagram that illustrates a solid state detector 50 according to a fourth embodiment of the present invention. The solid state detector 50 will be described with reference to FIG. 6. Note that parts of the solid state detector 50, which are of the same construction as those of the solid state detector 1, are labeled with the same reference numerals, and descriptions thereof will be omitted.

A connecting member 59 of the solid state detector 50 illustrated in FIG. 6 is formed of gold for example. The connecting member 59 electrically connects the second electrode 6 and an external terminal 51. The connecting member 59 is an amalgam, in which gold is dissolved in mercury, from which the mercury has been removed. The connecting member 59 is formed by the steps illustrated in FIGS. 7A and 7B.

First, as illustrated in FIG. 7A, the amalgam, which is mercury with a metal dissolved therein, is provided on the second electrode. The amalgam is in the form of a paste, and therefore does not shift from the position at which it is coated on the second electrode 6. Then, the external terminal 51 is placed on the amalgam.

Next, as illustrated in FIG. 7B, the solid state detector 50, on which the amalgam has been provided, is placed in a vacuum, and heat is applied at a temperature that does not cause defects due to phase transition to the photoconductive layers 3 and 5. Thereby, the mercury is removed from the amalgam, and the second electrode 6 and the external terminal 51 are connected by the connecting member 59, which is formed of gold. That is, the boiling point of mercury under atmospheric pressure is 356.58° C., the vapor pressure is 0.0122 Torr (at 20° C.) and 0.271 Torr (at 100° C.). Therefore, mercury vaporizes at 20° C. if the pressure is 0.001 Torr or less, and at approximately 35° C. if the pressure is 0.037 Torr ($\approx$0.005 hPa$\approx$0.5 Pa). In addition, transmission of heat by air can be substantially ignored, because the air pressure is low. Accordingly, generation of defects in the photoconductive layers due to phase transition, caused by heat applied during removal of mercury from the amalgam, is suppressed.

According to the fourth embodiment described above, heat is applied at a temperature that does not cause phase transition of the photoconductive layers 3 and 5, when establishing the electrical connection between the second electrode 6 and the external terminal 10. Therefore, generation of defects in the photoconductive layers 3 and 5 due to heat, and consequently, deterioration in image quality, can be prevented.

Note that in the case that the connecting member 59 is formed employing an amalgam, a protective layer that prevents amalgamation of the recording photoconductive layer 5 may be provided between the recording photoconductive layer 5 and the second electrode 6.

The present invention is not limited to the embodiments described above. For example, each of the solid state detectors of the above embodiments are configured such that image information is read out therefrom by irradiating readout light thereon. However, the solid state detectors may be of the type disclosed, for example, in Japanese Unexamined Patent Publication No. 2000-346951, from which image information is read out without irradiating readout light thereon. It is necessary for a second electrode to be provided on a photoconductive layer, and necessary to apply recording voltage HV during recording of image information for this type of solid state detectors as well. Accordingly, if an electrical connection with a voltage source is established by employing the aforementioned connecting members, generation of defects in the photoconductive layer can be prevented.

An amalgamized metal is employed as the connecting member 59 in the solid state detector 50 illustrated in FIG. 6. Alternatively, a conductive adhesive may be employed. In this case, the external terminal 51 and the second electrode 6 can be electrically connected without applying heat. Therefore, generation of defects in the photoconductive layer due to heat can be prevented.

Further, in each of the embodiments described above, the electrical connection between the second electrode 6 and the connecting members 9, 29, 49, and 59 may be established either within an image obtaining region, where image information is recorded, or in a non-image obtaining region. Particularly in the case that the connecting members and the external terminals are formed within the image obtaining region, the necessity to form a region within the XY plane, at which the second electrode and the connecting members are connected, is obviated. Therefore, the solid state detector, as well as the image readout apparatus that employs the solid state detector, can be miniaturized.

In the case that the connection is established within the image obtaining region, it is preferable that the connecting members and the external terminals are formed of a material that is transmissive with respect to recording electromagnetic waves, such as ITO. In this case, when the solid state detector is irradiated with the recording electromagnetic waves, the recording electromagnetic waves are not blocked by the connecting members or the external terminals, and are able to reach the recording photoconductive layer. Accordingly, the generation of artifacts, caused by the presence of the connecting members and the external terminals, can be prevented.

In the solid state detector 70 illustrated in FIG. 8, a conductive layer that extends from the second electrode 6 to an external terminal 30, which is provided on the substrate B, is formed when forming the second electrode 6 as a thin film. The conductive layer functions as a connecting member 79, which is formed simultaneously with the second electrode 6. In this case, the connecting member 79 is formed simultaneously with the second electrode 6, which reduces the manufacturing time and improves manufacturing efficiency. Note that an insulative film layer is formed between the side surface (XZ plane) of the solid state detector 70 and the connecting member 79.

What is claimed is:

1. A solid state detector provided on a substrate, comprising:
    first electrodes, stacked on the substrate;
    a photoconductive layer that generates charges corresponding to amounts of recording electromagnetic waves bearing image information, stacked on the first electrodes;
    a second electrode, stacked on the photoconductive layer;
    a charge accumulating portion that records the image information by accumulating the charges generated by the photoconductive layer;
    an external terminal, which is electrically connected to a voltage source for applying recording voltage to the second electrode during recording of the image information in the charge accumulating portion; and
    a connecting member, having a first end connected to the external terminal, and a second end, which is an elastic conductive material, connected to the second electrode by elastic force.

2. A solid state detector as defined in claim 1, wherein:
    the portion of the connecting member that contacts the second electrode is formed by a material having a lower hardness than the material of the second electrode.

* * * * *